US006975183B2

(12) United States Patent
Aigner et al.

(10) Patent No.: US 6,975,183 B2
(45) Date of Patent: Dec. 13, 2005

(54) BAW RESONATOR HAVING PIEZOELECTRIC LAYERS ORIENTED IN OPPOSED DIRECTIONS

(75) Inventors: Robert Aigner, Unterhaching (DE); Martin Handtmann, Munich (DE); Stephan Marksteiner, Putzbrunn (DE); Winfried Nessler, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/821,116

(22) Filed: Apr. 8, 2004

(65) Prior Publication Data

US 2005/0012568 A1 Jan. 20, 2005

Related U.S. Application Data

(63) Continuation of application No. PCT/EP02/07700, filed on Jul. 10, 2002.

(30) Foreign Application Priority Data

Oct. 8, 2001 (DE) ........................................ 101 49 542

(51) Int. Cl.[7] ............................ H03H 9/54; H03H 9/56; H03H 3/007

(52) U.S. Cl. ....................... 333/187; 333/189; 333/191; 310/357; 29/25.35

(58) Field of Search ................................ 333/186–192; 310/322–324, 335, 357; 29/25.35

(56) References Cited

U.S. PATENT DOCUMENTS

| | | | | |
|---|---|---|---|---|
| 3,590,287 A | 6/1971 | Berlincourt et al. | ........ | 310/321 |
| 5,373,268 A | * 12/1994 | Dworsky et al. | ........... | 333/187 |
| 5,864,261 A | * 1/1999 | Weber | ........................ | 333/187 |
| 5,872,493 A | * 2/1999 | Ella | ........................... | 333/191 |
| 5,929,555 A | * 7/1999 | Sugimoto et al. | ........... | 310/360 |
| 6,243,933 B1 | * 6/2001 | Sugimoto et al. | .......... | 29/25.35 |
| 6,437,482 B1 | * 8/2002 | Shibata | ....................... | 310/320 |
| 6,437,484 B1 | * 8/2002 | Nishimura et al. | ......... | 310/324 |
| 6,670,866 B2 | * 12/2003 | Ella et al. | ................... | 333/133 |

FOREIGN PATENT DOCUMENTS

| | | |
|---|---|---|
| EP | 0609555 A2 | 8/1994 |
| EP | 0802628 A2 | 10/1997 |
| EP | 1047189 A2 | 10/2000 |
| JP | 2001185984 A | 7/2001 |

OTHER PUBLICATIONS

Lakin et al., "Stacked Crystal Filters Implemented with Thin Films", 43rd Annual Symposium on Frequency Control, 1989, pages 536–543.

Ruffner et al., "Effect of Substrate Composition on the Piezoelectric Response of Reactively Sputtered AIN Thin Films", Thin Solid Films 354, 1999, pages 256–261.

Chen et al., "High–frequency Resonance in Acoustic Superlattice of Periodically Poled $LiTaO_3$", Appl. Phys. Lett. 70(5), Feb. 1997, pages 592–594.

Hayashi et al., "Lead Titanate Ceramics for High Frequency Resonator", Proc. of the 2000 12th IEEE Symposium on Applications of Ferroelectrics, vol. 1, S., pages 289–292.

Kawasaki et al., "Variable Property Crystal Resonators by Direct Bonding Techniques", IEEE Ultrasonics Symposium, 1996, pages 897–900.

Lakin et al., "Development of Miniature Filters for Wireless Applications", IEEE Transactions on Microwave Theory and Techniques, vol. 43, No. 12, Dec. 1995, pages 2933–2935.

* cited by examiner

*Primary Examiner*—Barbara Summons
(74) *Attorney, Agent, or Firm*—Maginot, Moore & Beck

(57) ABSTRACT

A BAW resonator includes a first piezoelectric layer made of a material oriented toward a first direction, and a second piezoelectric layer made of a material oriented toward a second direction which is opposed to the first direction. The first piezoelectric layer and the second piezoelectric layer are acoustically coupled with each other.

20 Claims, 4 Drawing Sheets

A

B

A

B

BAW RESONATOR HAVING PIEZOELECTRIC LAYERS ORIENTED IN OPPOSED DIRECTIONS

CROSS-REFERENCE TO RELATED APPLICATION

This application is a continuation of copending International Application No. PCT/EP02/07700, filed Jul. 10, 2002, which designated the United States and was not published in English.

BACKGROUND OF THE INVENTION

1. Field of the Invention

The present invention relates to a BAW resonator (BAW= bulk acoustic wave). In particular, the present invention relates to BAW resonators having a plurality of layers comprising different material orientations. In addition, the present invention relates to BAW filters comprising such BAW resonators.

2. Description of Prior Art

BAW filters comprising one or several BAW resonators, e.g. in a ladder-type circuit, have been known in the art. The BAW resonators used for these BAW filters are so-called thin-film BAW resonators, i.e. resonators comprising a piezoelectric thin film. The disadvantage of these prior art BAW filters is that no filter topology is known which converts signals from unbalanced/balanced signals to balanced/unbalanced signals without entailing restrictions with regard to the common-mode load impedance toward mass, or which can do without the additional coils or transformers/converters.

A further disadvantage of these prior art BAW filters is that they include, at frequencies of more than 5 GHz, piezolayers whose thicknesses for a fundamental-mode wave (fundamental-mode BAW) are extremely thin (<300 nm). A further disadvantage is that at such frequencies of more than 5 GHz, those resonators which have a predetermined impedance level are smaller than is desired for performance reasons, since this yields, for example, a poor ratio of area and circumference of the arrangement, which leads to strong parasitic effects.

Yet another disadvantage of the prior art BAW filter is the fact that the thickness of a piezolayer for a fundamental-mode wave (fundamental-mode BAW) will be quite thick (>5 $\mu$m) at frequencies below 500 MHz. This leads to the added disadvantage that considering a dielectric constant of 10 (of the substrate), a respective individual resonator having an impedance level of 50 ohm will require an area of >0.5 $mm^2$.

Even though in the prior art solutions have been known by means of which the problem of converting balanced/unbalanced signals into unbalanced/balanced signals is made possible, these solutions, too, pose the above-mentioned problems in connection with the common-mode load impedance toward mass, and/or in connection with the use of additional devices.

The prior art has known solutions for filter arrangements for frequencies above 5 GHz, but it is cavity resonators or ceramic resonators that are typically used for this purpose, which are both rather bulky, lossy in terms of electricity and very expensive.

For frequency ranges of up to 200 MHz, quartz-crystal resonators, whose highest operating frequency nowadays is 200 MHz, have been known in the prior art. Filter operations in the range from 100 MHz to 2 GHz are performed mainly using surface acoustic wave filters (SAW Filters), which have the drawback that they are rather bulky and are, in addition, very expensive in the range of less than 500 MHz.

In addition, stacked crystal-resonator structures have been known in the art. In this context, reference shall be made to the article "Stacked Crystal Filter Implemented with Thin Films" by K. M. Lakin et al., $43^{rd}$ Annual Symposium on Frequency Control (1989), pages 536–543.

SUMMARY OF THE INVENTION

Starting from this prior art, it is the object of the present invention to provide an improved BAW resonator which does not have the drawbacks mentioned in connection with the prior art.

The present invention provides a BAW resonator having a first piezoelectric layer made of a material oriented toward a first direction; and a second piezoelectric layer made of a material oriented toward a second direction opposed to the first direction; the first piezoelectric layer and the second piezoelectric layer being acoustically coupled with each other; a first electrode, on which the first piezoelectric layer is at least partially formed; a second electrode formed at least partially on the first piezoelectric layer, the second piezoelectric layer being at least partially arranged on a first portion of the second electrode; an additional first piezoelectric layer arranged at least partially on a second portion of the second electrode, the second piezoelectric layer and the additional first piezoelectric layer being arranged so as to be spaced apart from each other; a third electrode arranged at least partially on the second piezoelectric layer; and a fourth electrode arranged at least partially on the additional first piezoelectric layer.

In accordance with a preferred embodiment, the present invention provides a BAW filter comprising one or several of the inventive BAW resonators.

The present invention is based on the findings that the disadvantages, discussed at the outset, of prior art BAW filters and/or prior art BAW resonators may be avoided in that the BAW resonators comprise piezoelectric layers and/or portions in a piezoelectric material, whose orientations are opposed to one another (are aligned in an inverted manner). In this way, firstly, it is possible to significantly increase the scope of possible applications of such BAW resonators, and, secondly, it is possible to increase the available frequency ranges for the use of such BAW resonators.

In a piezoelectric thin film, the mechanical stress is proportional to the electrical field applied. The material-coupling coefficient for $k_{mat}$ defines the amplitude and the sign of the voltage for a given electric field, and vice versa. $k_{mat}$ is directly associated with the properties within the (mono- or poly-) crystalline structure of the thin film, such as the preferred alignment, the purity and the grain size of the material used.

Examples of widely used materials for piezoelectric thin films are AlN or $ZnO_2$, which may be deposited in a manner resulting in polycrystalline layers having a preferred c-axis alignment of the column-shaped grains, i.e. orientation. The deposition conditions and growth conditions determine whether the c-axis is directed upwards or whether it is directed downwards, as has been described by J. A. Ruffner et al. in "Effect of substrate composition on the piezoelectric response of reactively sputtered AlN thin films" in Thin Solid Firms 354, 1999, pages 256–261.

In more complex piezoelectric (ferroelectric) materials, such as PZT (lead zirconium titanate), the preferred alignment (orientation), which is also referred to as polarization in such materials, is adjusted by a polarization process which follows the deposition. For this purpose, a strong electric field is applied to the material at elevated temperatures.

The orientation of the material of the piezoelectric layer causes the layer to contract when an electric field is applied in a first direction corresponding to the direction of orientation, and to expand when an electric field is applied in a second direction opposed to the direction of orientation.

The sign of $k_{mat}$ is irrelevant to the electrical response of a simple BAW resonator, since it is only $k^2_{mat}$ that comes up in the formula valid for the electrical response. For BAW elements having more than one piezoelectric layer in the acoustic stack, such as stacked crystal filters, several interesting properties may be achieved by using piezoelectric layers having different alignments (reversed signs of $k_{mat}$).

BRIEF DESCRIPTION OF THE DRAWINGS

Preferred embodiments of the present invention will be explained in more detail below with reference to the accompanying figures, wherein.

DESCRIPTION OF PREFERRED EMBODIMENTS

Figure 1:
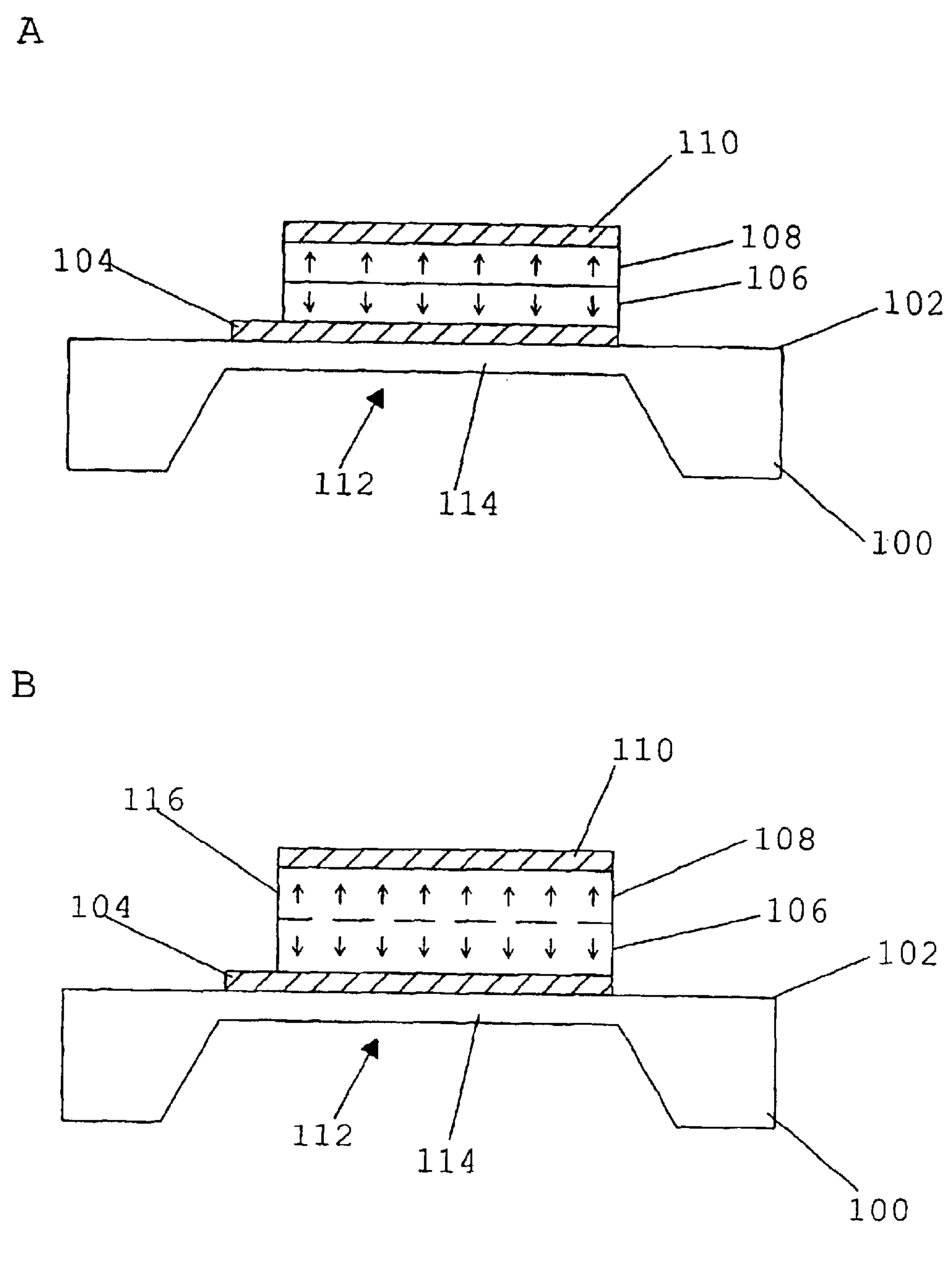
FIG. 1A shows a BAW resonator in accordance with the present invention and in accordance with a first embodiment.
FIG. 1B shows a BAW resonator in accordance with the present invention and in accordance with a second embodiment.

FIG. 1A shows a first embodiment of a BAW resonator in accordance with the present invention. The BAW resonator includes a substrate 100 comprising a first main surface 102 which has a first lead electrode 104 made of a metal or another conductive material formed thereon. Electrode 104 has a first piezoelectric layer 106 arranged thereon, which, in turn, has a second piezoelectric layer 108 arranged thereon. A second electrode 110 made of a metal or another conductive material is arranged on the piezoelectric layer 108. The first electrode 104 is, for example, an input electrode, and the second electrode 110 is, for example, an output electrode. Substrate 100 includes a recess 112 for forming a diaphragm area 114 which has the BAW resonator formed thereon so as to label acoustic decoupling of the resonator from underlying elements and/or layers. Alternatively, decoupling may also be achieved by a so-called acoustic reflector which would then be arranged between substrate 100 and electrode 104. Both decoupling by means of a diaphragm and decoupling using an acoustic reflector have been known to those skilled in the art.

The first piezoelectric layer 106 has been grown such that the material within same is oriented in the direction of the arrows shown in FIG. 1A, in layer 106, i.e. that layer 106 has been polarized in this direction. The second layer 108 has been produced such that the alignment of the material in this layer, i.e. the polarization of this material, is in a direction opposed to the polarization in layer 106, as may be seen by the opposed arrows in layer 108 in FIG. 1A. Alternatively, in ferroelectric materials, the polarization of the layers may also be achieved after the deposition of same, by applying a suitable electric field. In this case, the piezoelectric layers 106 and 108 are made of, for example, PZT Material (lead zirconium titanate). Otherwise, the layers are made of, for example, AlN or $ZnO_2$.

FIG. 1B represents a second embodiment of the inventive BAW resonator, which embodiment differs from the embodiment described with reference to FIG. 1A in that a piezoelectric material 116 is arranged between electrodes 104 and 110 instead of the two separated piezoelectric layers 106 and 108. Thus, only one piezoelectric layer 116 is provided. However, layer 116 is made such that it comprises a first portion 106 and a second portion 108, in which the alignments or orientations (polarization) of the material of the piezoelectric layer 116 are mutually opposed, as is shown by the arrows. The various portions are separated by the dashed line in FIG. 1B.

The layer 116 shown in FIG. 1B is made, for example, such that the first portion 106 is initially grown using process parameters enabling the alignment shown there. Subsequently, the second portion 108 is grown to the thus produced portion 106, using other process parameters so as to achieve the opposed orientation in portion 108, FIG. 1B. In this case, the piezoelectric layer 116 consists of AlN or $ZnO_2$. Alternatively, however, layer 116 may also consist of a ferroelectric material wherein polarization is caused by applying an electric field, it having to be ensured, in this connection, that after the deposition of the first portion of the first layer 106 and after the polarization of same, the application of an additional electric field to the entire structure for polarizing layer 108 results in no more re-polarization of portion 106.

The piezoelectric layers are arranged such that they are acoustically coupled with one another. The layers may be arranged so as to be mutually adjacent or spaced apart, the latter case enabling the provision of one or several layers between them.

Figure 2:
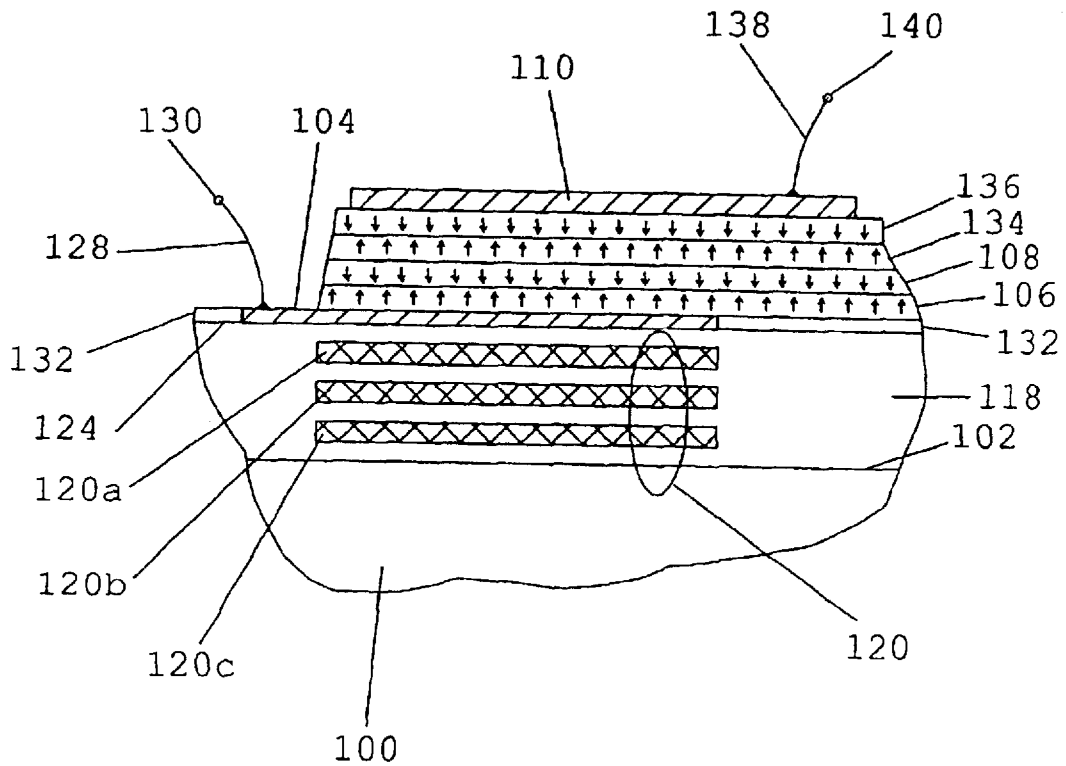
FIG. 2A shows a BAW resonator having a plurality of piezoelectric layers with alternating alignments in accordance with a third embodiment of the present invention.
FIG. 2B shows a standing wave in the piezoelectric layers of the BAW resonator of FIG. 2A.
Figure 2:
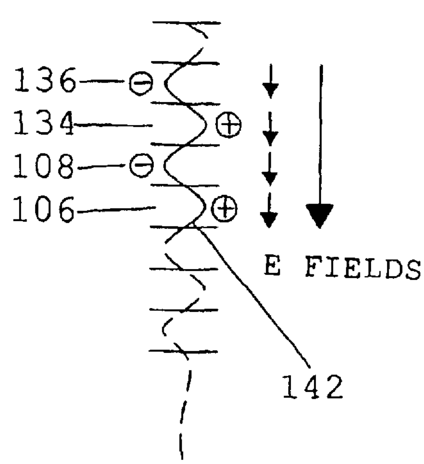
Figure 3:
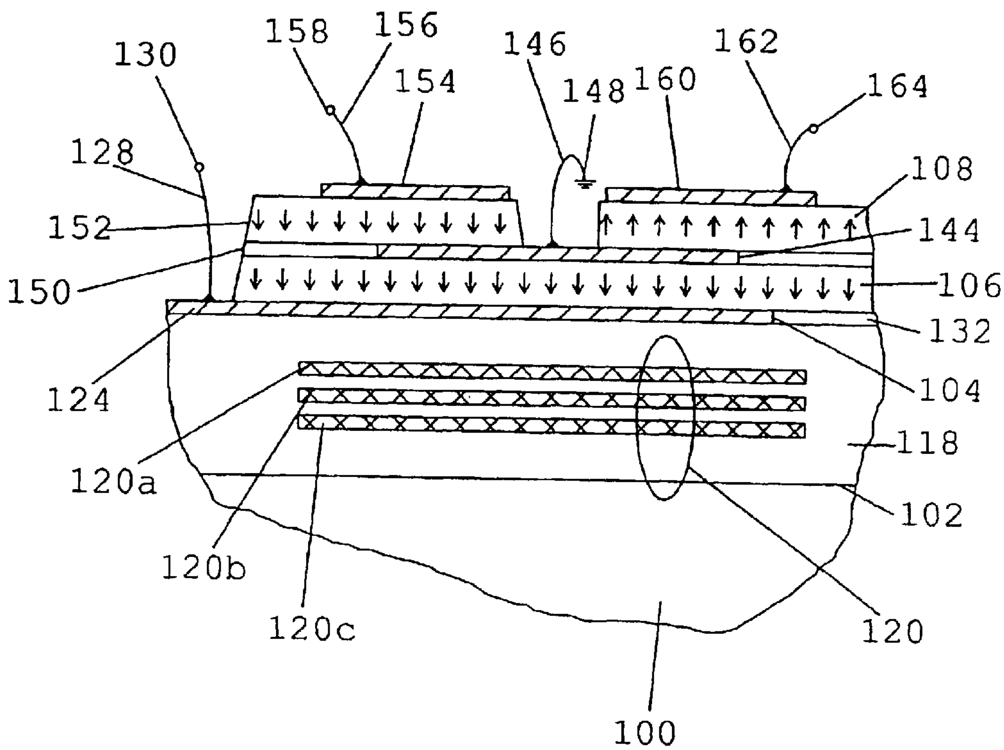
FIG. 3 shows an embodiment for converting an unbalanced input signal into a balanced output signal using an inventive BAW resonator.
Figure 4:
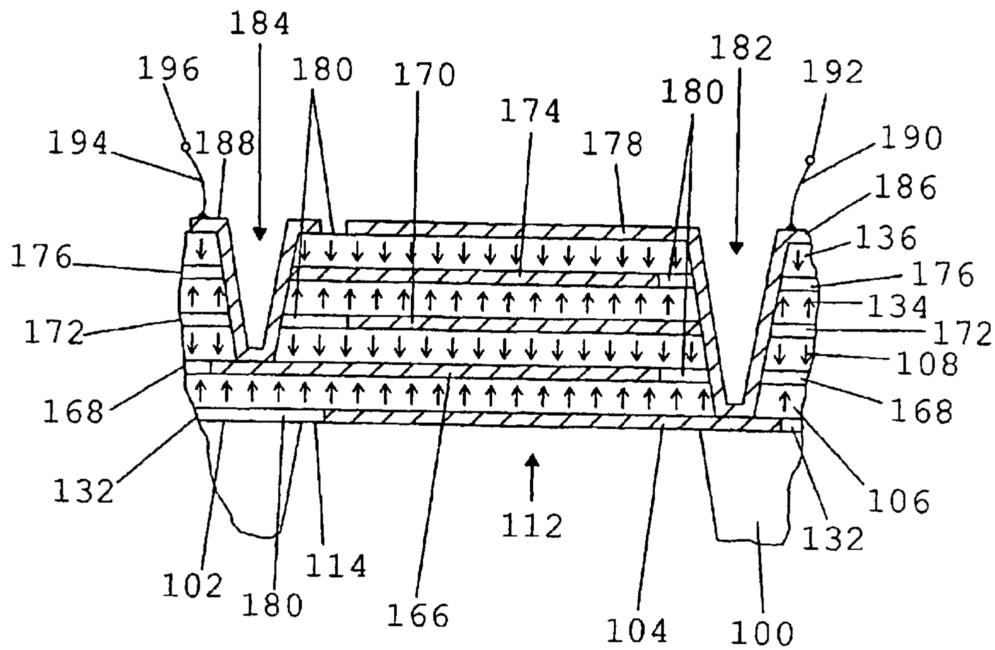
FIG. 4A shows an embodiment of a BAW resonator reduced in size.
FIG. 4B shows the course of the voltage with/including signs and of the electric fields in the layers of the BAW resonator of FIG. 4A.
Figure 4:
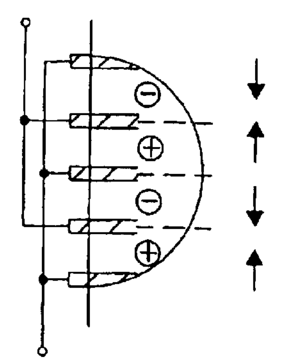

With reference to FIGS. 2 to 4, embodiments of arrangements will be described below which employ the inventive BAW resonators described with reference to FIGS. 1A and 1B so as to open up new fields of applications for the BAW resonators and, in addition, new frequency ranges for same.

FIG. 2A shows an embodiment of a high-frequency resonator which has a 1-port and has N=4 piezoelectric layers with alternating alignments.

As is shown in FIG. 2A, a first main surface 102 of substrate 100 has a reflector layer 118 formed thereon, wherein an acoustic mirror or acoustic reflector 120 is arranged which comprises a number of individual layers 120*a* to 120*c*, which alternatingly include high and low acoustic impedances. By means of the acoustic reflector 120 the BAW-resonator arrangement disposed above is acoustically decoupled from the substrate. The reflector 120 described is known per se known among those skilled in the art and will therefore not be explained in further detail.

A main surface 124, facing away from substrate 100, of the reflector layer 118 has formed thereon, at least partially, the first (lower) electrode 104 connectable to a terminal 130 via a wire 128. Those areas of the main surface 124 of the reflector layer 118 which are not covered by the first electrode 104 are covered by an insulating layer 132. The first piezoelectric layer 106 is arranged on the electrode 104 and on a portion of the insulating layer 132. The first piezoelectric layer 106 has the second piezoelectric layer 108 arranged thereon, which in turn has an additional piezoelectric layer 134 and an additional second piezoelectric layer 136 arranged thereon. As is shown in FIG. 2A (see arrows in the respective piezoelectric layers), the orientations of the materials in the individual layers are opposed to one another.

The additional second piezoelectric layer 136 has the second (upper) electrode 110 arranged thereon, which is connectable to a terminal 140 via a wire 138.

In the embodiment shown in FIG. 2A, the BAW resonator is formed in the area in which the lower electrode 104 and the upper electrode 110 overlap, and layers 120*a* to 120*c* of the acoustic mirror or reflector 120 extend across this area, too.

The stacked layer structure of piezoelectric layers having alternating alignments, the structure being shown in FIG. 2A, is advantageous, in particular, for bulk acoustic waves at high frequencies. As an alternative to the embodiment shown in FIG. 2A, additional metal layers or other intermediate layers may be provided between the individual piezoelectric layers 106, 108, 134, 136, but it is not absolutely necessary for the operation of same as a resonator to electrically connect these layers. At frequencies corresponding to half the acoustic wavelength in each of the piezoelectric layers, the element shown in FIG. 2A has strong series resonances and parallel resonances. The stack of piezoelectric layers arranged between the two electrodes 104 and 110 operates in a overmode. The electrical field has the same alignment throughout the stack, but the alternating orientations of the material ensure that the coupling to this overmode is the strongest compared to any other mode at a lower or a higher frequency.

FIG. 2B shows the standing wave 142 occurring in the stack of piezoelectric layers 106, 108, 134, 136. As may be seen from FIG. 2B, the negative half-waves of the voltage are rectified by the inverted alignment of the piezoelectric layers 1 and 3 as compared with layers 3 and 4. In addition, the course of the electric fields and their signs of same are indicated. Since of overall thickness of the piezoelectric material arranged between electrodes 104 and 110 is larger, by the layer factor N (N=number of piezoelectric layers), than in a simple resonator, the ratio of surface and circumference is also increased by the factor of N, which results in an improved resonator performance, since the parasitic effects may now be reduced. Instead of the approach, shown in FIG. 2A, of insulating the element from the substrate by means of the acoustic mirror 120, this element may also be arranged on a diaphragm area (see FIG. 1).

The advantage of the structure, shown in FIG. 2A, which uses the acoustic mirror 120 is that these acoustic mirrors 120 are easy to manufacture and exhibit increased robustness at relatively high frequencies.

With reference to FIG. 3, an embodiment will be described below, in which, using the inventive BAW resonator, a BAW element will be provided which enables a conversion of balanced/unbalanced to unbalanced/balanced signals. In FIG. 1, elements which have already been described with reference to FIGS. 1 and 2 and which have the same or a similar effect have been given the same reference numerals.

Similar to FIG. 2, the first (lower) electrode 104 is partially formed on the surface 124 of the reflector layer 118, that portion of the surface 124 which is not covered by the electrode 104 made of a metal or a conductive material being covered by an insulating material 132. The first piezoelectric layer 106 is arranged on a portion of the lower electrode 104 as well as on a portion of the insulating layer 132. That surface of the first piezoelectric layer 106 which faces away from the substrate 100 has arranged thereon, at least partially, a third electrode 144 connectable to a reference potential 148, e.g. mass, via a wire 146. Those portions of the surface of the first piezoelectric layer 106 facing away from the substrate 100 which are not covered by the third electrode 144 are covered by an insulating material 150.

The second piezoelectric layer 108 is arranged on the first piezoelectric layer 106 such that it covers part of the latter, the second piezoelectric layer 108 being at least partially arranged on the third electrode 144. Spaced away from the second piezoelectric layer 108, an additional first piezoelectric layer 152 is arranged on the first piezoelectric layer 106, the additional first piezoelectric layer 152 being at least partially arranged on the third electrode 144. In the embodiment shown in FIG. 3, the second piezoelectric layer 108 and the additional first piezoelectric layer 152 are arranged on the third electrode 144 in a spaced-apart manner such that the wire 146 between the second piezoelectric layer 108 and the additional first piezoelectric layer 152 is connected to the third electrode.

A fourth electrode 154 is arranged at least partially on the additional first piezoelectric layer 152, the electrode 154 being connectable to a terminal 158 via a wire 156. Similarly, the second piezoelectric layer 108 has a fifth electrode 160 arranged thereon which is connectable to a terminal 164 via a wire 162.

By means of the arrangement shown in FIG. 3, a pair of stacked layers is actually formed, the portion of the element situated on the right-hand side of FIG. 3 having piezoelectric layers with opposed orientations (polarization), and the area on the left-hand side in FIG. 3 having piezoelectric layers with the same orientations (polarization). The structure shown in FIG. 3 may also be employed using a diaphragm (see FIG. 1) instead of using the acoustic mirror 120 shown.

If the terminal 130 is an input terminal and if the terminals 158 and 164 are two output terminals, the structure shown in FIG. 3 performs a conversion of unbalanced signals to balanced signals, and filtering is also carried out. If the terminal 130 is an output terminal and if the terminals 158 and 164 are input terminals, the structure shown performs a conversion of balanced signals to unbalanced signals in addition to the filtering.

The structure shown in FIG. 1, which is a pair of stacked resonators, includes a common center electrode 144 (mass) and a common external electrode 104. The piezoelectric layers situation beneath one of the remaining electrodes exhibits an inverted orientation (polarization) compared to the other piezoelectric layers, and consequently generates a signal having an inverted sign at this output. On the condition that $$k_{mat\text{-}108}=-k_{mat\text{-}106},$$

the structure of FIG. 3 performs a perfect conversion of an unbalanced signal to a balanced signal.

A further preferred embodiment of the present invention will be explained below with reference to FIG. 4, wherein, again, elements which have already been described with reference to the previous figures and have the same or a similar effect bear the same reference numerals and will not be described again.

FIG. 4A shows a resonator for low frequencies which includes N=4 piezoelectric layers having alternating orientations (polarization). Unlike in the embodiment previously described in FIGS. 2 and 3, the resonator device is realized here using the "diaphragm approach" (see FIG. 1). The diaphragm 114 includes the insulating portion 132 as well as the lower, or first, electrode 104 which has the first piezoelectric layer 106 formed thereon. A portion of the surface of the piezoelectric layer 106, the surface facing away from the substrate 100, has a second electrode 166 formed thereon, and the remaining portions of the surface of the piezoelectric layer 106, the surface facing away from substrate 100, are covered by an insulating layer 168. The second electrode 166 and the insulating layer 168 have the second piezoelectric layer 108 formed thereon, on the exposed surface of which, in turn, a third electrode 170 is at least partially formed. The remaining areas of the exposed surface of the second piezoelectric layer 108 are covered by an insulating layer 172. The third electrode 170 and the insulating layer 172 have an additional first piezoelectric layer 134 formed thereon, which have, in turn, a fourth electrode 174 formed thereon at least partially. The remaining areas of the additional first piezoelectric layer 134 have an insulating layer 176 formed thereon. The fourth electrode 174 and the insulating layer 176 have an additional second piezoelectric layer 136 formed thereon, on the exposed surface of which a fifth electrode is formed at least partially.

As may be seen from FIG. 4A, the first electrode 104, the third electrode 170 and the fifth electrode 178 are formed such that they overlap, whereby a first group of electrodes is formed. The second electrode 168 and the fourth electrode 174 are also arranged so as to be overlapping, and form a second group of electrodes. The first group of electrodes and the second group of electrodes are arranged so to be only partially overlapping, so that the areas 180 shown in FIG. 4A are yielded without any conductive material.

The stack of piezoelectric layers 106, 108, 134 and 136 has two trenches 182 and 184 formed therein, which have metalizations 186 and 188, respectively. The trenches 182 and 184 are formed such that the metalizations 186 and 188, respectively, arranged therein are connected to the first group of electrodes (electrodes 104, 172, 178) and to the second group of electrodes (electrodes 166, 174), respectively, as may be seen in FIG. 4A.

The first metalization 186 is connected to a terminal 192 via a wire 190. Likewise, the second metalization 188 is connected to a terminal 196 via a wire 194.

The BAW resonator shown in FIG. 4A is optimized to reduce the size of the resonator for applications at low frequencies or to attain extremely low impedance levels. In this case of a stack of several piezoelectric layers with alternating orientations and with intermediate electrodes provided, a resonance behavior occurs in the fundamental mode or basic mode. This is achieved by applying alternating electric fields to the piezoelectric layers, which leads to a uniform voltage sign in the entire stack. From an electrical point of view, there are N capacitors connected in parallel, which means that either the area of the resonator is reduced by a factor of N, or that with an area which is constant compared to conventional resonators, the impedance is reduced by a factor of N.

As may be seen from FIG. 4B, the electrical fields are applied, due to the configuration, in a manner in which they alternate with the intermediate electrodes, so that a same sign of the voltage results throughout the entire stack. It shall be pointed out that the thicknesses of the piezoelectric layers and electrodes need not necessarily be identical for all n layers. With regard to the desired resonator bandwidth there may be an optimum solution which does not require identical thicknesses, which further enables adjusting the voltage distribution in the acoustic stack. Instead of the implementation shown in FIG. 4A using the "diaphragm approach", the implementation described with reference to FIG. 2 or 3 may also be employed using the acoustic reflector.

The above-described pads are led-out portions of the associated electrodes. The pads have an area sufficient for attaching the wire to the same.

Instead of the above-described embodiments for contacting the BAW resonators by means of bonding wires, other means of contacting are also known. The BAW resonators may be bonded with associated pads in flip-chip technology, for example. Other bonding methods known in the prior art may also be employed.

In addition to the above-described embodiments, wherein the piezoelectric layers are arranged on a substrate, a housing may be provided, in other embodiments, for fully enclosing the BAW resonator. In this case, acoustic decoupling is not only required toward the substrate but also toward the coverage. Preferably this is achieved by providing an additional acoustic reflector in the portion covering the BAW resonator.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A bulk acoustic wave resonator, comprising a first piezoelectric layer made of a material oriented toward a first direction; and a second piezoelectric layer made of a material oriented toward a second direction opposed to the first direction; the first piezoelectric layer and the second piezoelectric layer being acoustically coupled with each other;

a first electrode, on which the first piezoelectric layer is at least partially formed;

a second electrode formed at least partially on the first piezoelectric layer, the second piezoelectric layer being at least partially arranged on a first portion of the second electrode;

an additional first piezoelectric layer arranged at least partially on a second portion of the second electrode, the second piezoelectric layer and the additional first piezoelectric layer being arranged so as to be spaced apart from each other;

a third electrode arranged at least partially on the second piezoelectric layer; and a fourth electrode arranged at least partially on the additional first piezoelectric layer.

2. The bulk acoustic wave resonator as claimed in claim 1, comprising a substrate; and an acoustic reflector having the piezoelectric layers arranged thereon so that the piezoelectric layers are acoustically separated from the substrate.

3. The bulk acoustic wave resonator as claimed in claim 2, comprising an additional acoustic reflector arranged on the piezoelectric layers.

4. The bulk acoustic wave resonator as claimed in claim 1, comprising a substrate having a diaphragm area, the piezoelectric layers being arranged on the diaphragm area so that they are acoustically separated from the substrate.

5. The bulk acoustic wave resonator as claimed in claim 1, wherein the first electrode is an input electrode, the second electrode is a mass electrode, and the third and fourth electrodes are first and second output electrodes.

6. The bulk acoustic wave resonator as claimed in claim 1, wherein the first electrode is an output electrode, second electrode is a mass electrode, and the third and fourth electrodes are first and second input electrodes.

7. The bulk acoustic wave resonator as claimed in claim 1, wherein the orientation of the first and/or the second piezoelectric layer is specified by setting the growth conditions during the production of the first and/or the second piezoelectric layer.

8. The bulk acoustic wave resonator as claimed in claim 1, wherein the first and/or second piezoelectric layer consists of a ferroelectric material, the orientation of the first and/or second piezoelectric layer being specified, after producing the piezoelectric layers, by applying a suitable electrical field.

9. A bulk acoustic wave filter comprising at least one bulk acoustic wave resonator, the at least one bulk acoustic wave resonator comprising a first piezoelectric layer made of a material oriented toward a first direction; and a second piezoelectric layer made of a material oriented toward a second direction opposed to the first direction; the first piezoelectric layer and the second piezoelectric layer being acoustically coupled with each other;

a first electrode, on which the first piezoelectric layer is at least partially formed;

a second electrode formed at least partially on the first piezoelectric layer, the second piezoelectric layer being at least partially arranged on a first portion of the second electrode;

an additional first piezoelectric layer arranged at least partially on a second portion of the second electrode, the second piezoelectric layer and the additional first piezoelectric layer being arranged so as to be spaced apart from each other;

a third electrode arranged at least partially on the second piezoelectric layer; and a fourth electrode arranged at least partially on the additional first piezoelectric layer.

10. The bulk acoustic wave filter of claim 9, wherein the first and/or second piezoelectric layer consists of a ferroelectric material, the orientation of the first and/or second piezoelectric layer being specified, after producing the first and/or second piezoelectric layer, by applying a suitable electrical field.

11. A method of manufacturing a bulk acoustic wave resonator comprising the steps of:

forming a first piezoelectric layer having a first polarization;

forming a second piezoelectric layer having a second polarization at a distance above the first piezoelectric layer, the second polarization opposite the first polarization; and forming above the first piezoelectric layer a third piezoelectric layer having the first polarization, the third piezoelectric layer at the same distance above the first piezoelectric layer as the second piezoelectric layer and spaced apart from the second piezoelectric layer.

12. The method of claim 11, further comprising, before the step of forming a first piezoelectric layer, the step of, forming a first electrode, and wherein the step of forming a first piezoelectric layer comprises the step of forming the first piezoelectric layer at least partially above the first electrode.

13. The method of claim 12, further comprising, before the step of forming a second piezoelectric layer, the step of, forming a second electrode at least partially above the first piezoelectric layer and wherein the step of forming a second piezoelectric layer comprises the step of forming the second piezoelectric layer at least partially above the second electrode.

14. The method of claim 13, wherein the step of forming a second electrode is performed prior to the step of forming a third piezoelectric layer.

15. The method of claim 13, wherein:

the step of forming a first piezoelectric layer comprises the steps of, forming a first piezoelectric layer with a ferroelectric material, and applying an electric field to the ferroelectric material of the first piezoelectric layer to obtain the first polarization;

the step of forming a second piezoelectric layer comprises the steps of, forming a second piezoelectric layer with a ferroelectric material, and applying an electric field to the ferroelectric material of the second piezoelectric layer to obtain the second polarization; and the step of forming a third piezoelectric layer comprises the steps of, forming a third piezoelectric layer with a ferroelectric material, and applying an electric field to the ferroelectric material of the third piezoelectric layer to obtain the first polarization.

16. The method of claim 15, wherein the step of applying an electric field to the ferroelectric material of the third piezoelectric layer is performed prior to the step of applying an electric field to the ferroelectric material of the second piezoelectric layer.

17. The method of claim 15, wherein the step of applying an electric field to the ferroelectric material of the first piezoelectric layer is performed in conjunction with the step of applying an electric field to the ferroelectric material of the third piezoelectric layer.

18. The method of claim 13, further comprising the step of:

providing a substrate having a diaphragm, and wherein the step of forming a first piezoelectric layer comprises the step of:

forming a first piezoelectric layer above the diaphragm of the substrate.

19. The method of claim 13, further comprising the step of:

providing an acoustic reflector, and wherein the step of forming a first piezoelectric layer comprises the step of:

forming a first piezoelectric layer above the acoustic reflector.

20. The method of claim 13, further comprising the steps of:

forming a third electrode at least partially above the second piezoelectric layer; and forming a fourth electrode at least partially above the third piezoelectric layer.

* * * * *